(12) United States Patent
Takekuma et al.

(10) Patent No.: US 6,617,617 B2
(45) Date of Patent: Sep. 9, 2003

(54) LIGHT-EMITTING DIODE

(75) Inventors: Akira Takekuma, Tama (JP); Shunichi Ishikawa, Machida (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/929,332

(22) Filed: Aug. 14, 2001

(65) Prior Publication Data
US 2002/0020848 A1 Feb. 21, 2002

(30) Foreign Application Priority Data
Aug. 18, 2000 (JP) ........................................ 2000-248969

(51) Int. Cl.⁷ .............................................. H01L 33/00
(52) U.S. Cl. .................... 257/99; 257/696; 257/736; 257/81
(58) Field of Search ............................ 257/81, 99, 696, 257/736

(56) References Cited

U.S. PATENT DOCUMENTS 5,313,367 A * 5/1994 Ishiyama ................... 361/772
5,814,837 A * 9/1998 Okazaki ....................... 257/91
6,093,940 A * 7/2000 Ishinaga et al. .............. 257/9
6,355,946 B1 * 3/2002 Ishinaga ..................... 257/98

FOREIGN PATENT DOCUMENTS

| JP | 4-10671 | 1/1992 |
| JP | 4-78795 | 3/1992 |
| JP | 06302864 | 10/1994 |
| JP | 11145523 | 5/1999 |
| JP | 11346007 | 12/1999 |

\* cited by examiner

Primary Examiner—Jerome Jackson

(57) ABSTRACT

A light-emitting diode with which the LED chip will not be destroyed comprises an LED chip 40 mounted on plate-shaped wiring means 60 inside a light-emitting diode. Wiring means 60 comprises conductive paths 61 and 62 that electrically lead to a pair of opposing surfaces. The top surface is used for mounting the LED chip. Part of the conductive paths 61, 62 are connected electrically to LED chip 40, extending from the position where the LED is mounted to leads 21 and 22, to which they are connected by soldering. LED chip 40 is supported by being held inside concave part 23 in one lead 21 at this time.

10 Claims, 5 Drawing Sheets

(a)

(b)

LIGHT-EMITTING DIODE

BACKGROUND OF THE INVENTION

1. Field of the Invention

The present invention pertains to a light-emitting diode comprising LED chips, that is, light-emitting diode chips.

2. Description of the Prior Art

Examples of this type of light-emitting diode are disclosed in Japanese Kokai Patent No. Hei 11(1999)-346,007 and Japanese Patent No. 2,982,553. The light-emitting diode disclosed in the former has LED chips and a pair of electrostatic protective elements in the concave part (or cup) made in one lead of a pair of leads. One electrode of a pair of electrodes of the LED chips is electrically connected to the lead holding the LED chip through the electrostatic protective elements, and the other electrode is connected to the electrostatic protective element and also electrically connected to another lead by wire bonding technique.

On the other hand, according to the latter document, a single LED chip is electrically connected such that the chip bridges a pair of leads. This type of mounting method is called flip-chip mounting. The advantage of flip-chip mounting is that it can prevent opening of wires for connection in temperature cycles, which can occur in the structure shown in the former document.

The structure of flip-chip mounting disclosed in the above documents shows resin, which can conventionally seal the diode chips from outside. In this case, because of relatively large thermal expansion coefficient of the resin, stress is generated in the LED chip when force is applied to the pair of leads from the resin due to thermal expansion and contraction, and the chip may be destroyed in the worst scenario. Consequently, the object of the present invention is to present a light-emitting diode with which the LED chip will not be destroyed.

SUMMARY OF THE INVENTION

The present invention provides a light-emitting diode, having an LED chip electrically connected to a pair of leads characterized in that said LED chip is mounted on a plate-shaped wiring means and connected to said pair of leads by said wiring means.

Preferably, said flexible wiring means is a single means.

Preferably, at least one of said pair of leads includes a support part for supporting a portion of said wiring means on which said LED chip is mounted.

Preferably, said support part is concave such that said support part can surround said LED chip.

Preferably, said wiring means comprises a 3-dimensional wiring means.

Preferably, said wiring means comprises a circuit board or tape-like electrical wire.

Preferably, an electronic element is further mounted on said wiring means, said element being selected from a group of a protective element and a sensor to monitor heat or light.

Preferably, said wiring means includes a pair of chip mounting electrodes mutually separated by only a relatively short distance and a pair of lead connecting electrodes mutually separated by a relatively long distance.

Preferably, said wiring means has flexibility.

Furthermore, the present invention provides a method of producing a light-emitting diode, comprising the steps of mounting at least one LED chip having a pair of electrodes on a plate-shaped wiring means with at least a pair of electrical paths, and mounting said wiring means on a pair of leads and thereby electrically connecting said pair of electrodes to said pair of leads by said pair of electrical paths.

Preferably, said step of mounting at least one LED chip comprises a step of mounting several LED chips on a single substrate, where said substrate includes s plurality of wiring means.

Preferably, said method further comprises a step of cutting said substrate to have specific dimensions such that said plurality of wiring means are separated after said step of mounting several LED chips.

Preferably, said method further comprises a step of testing said LED chips using said wiring means after said step of separating said plurality of wiring means.

According to the light-emitting diode of the present invention, the LED chip is mounted on a plate-shaped wiring means. The wiring means comprises a pair of conductive paths electrically connecting between a pair of opposing surfaces. One of the surfaces is for mounting an LED chip. The pair of conductive paths is electrically connected to the LED chip and extends from the LED-mounting section to the lead-connecting sections. The lead-connecting sections are connected to the corresponding lead by soldering. At least one of the lead-connecting sections overlap the LED chip mounted on the wiring means, and as a result, the LED is stabilized by being supported by the lead. It is preferred that the plate-shaped wiring means have at least some flexibility, but it can also be rigid.

Moreover, according to the method of producing semiconductor elements of the present invention, the LED chip is firstly mounted on a substrate including a single wiring means or a set of plurality of wiring means. In the latter case, the substrate is later cut into the appropriate dimensions and the plurality of wiring means can be separated. Then the required tests are performed on the LED chip mounted on the wiring means. When the tests have been completed, the wiring means is connected to the corresponding lead by a conventional method such as soldering, etc.

Definition of Symbols

21, 22; 121, 122; 221, 222; 321, 322; 421, 422 Leads
40; 140; 240; 340; 440 LED chip 60; 160; 260; 360; 460 Wiring means
61, 62; 161, 162, 163, 164; 261, 262, 263, 264;
361, 362, 363, 364; 461, 462 Electrode wires
380 Electrostatic protective element
23; 123; 223; 323; 423 Concave part (support part)

DESCRIPTION OF THE INVENTION

Preferred embodiments of the light-emitting diode and method of producing the same of the present invention will now be described in detail with reference to the figures.

Figure 1:
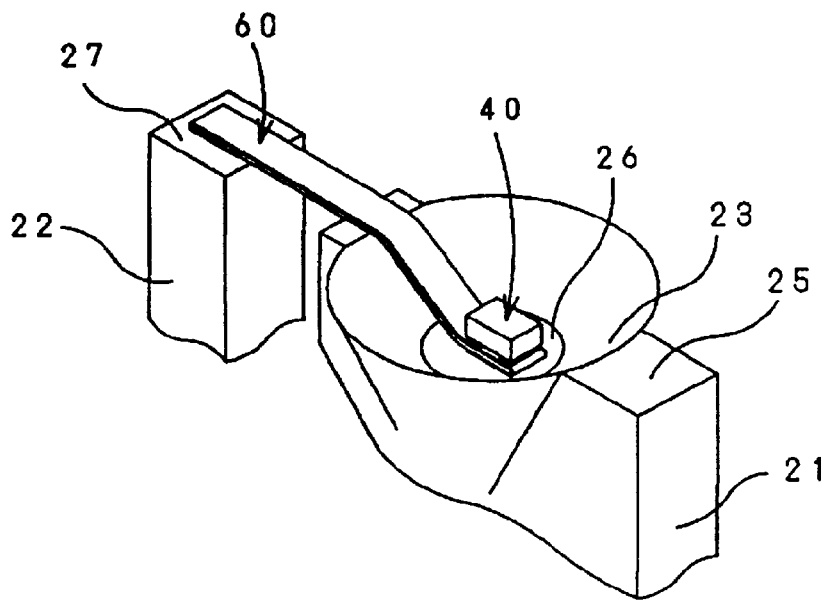
FIG. 1 is a figure showing a light-emitting diode showing the first embodiment of the present invention. (a) is an oblique view close to the end of the lead and (b) is a cross section view of the entire diode structure.
Figure 1:
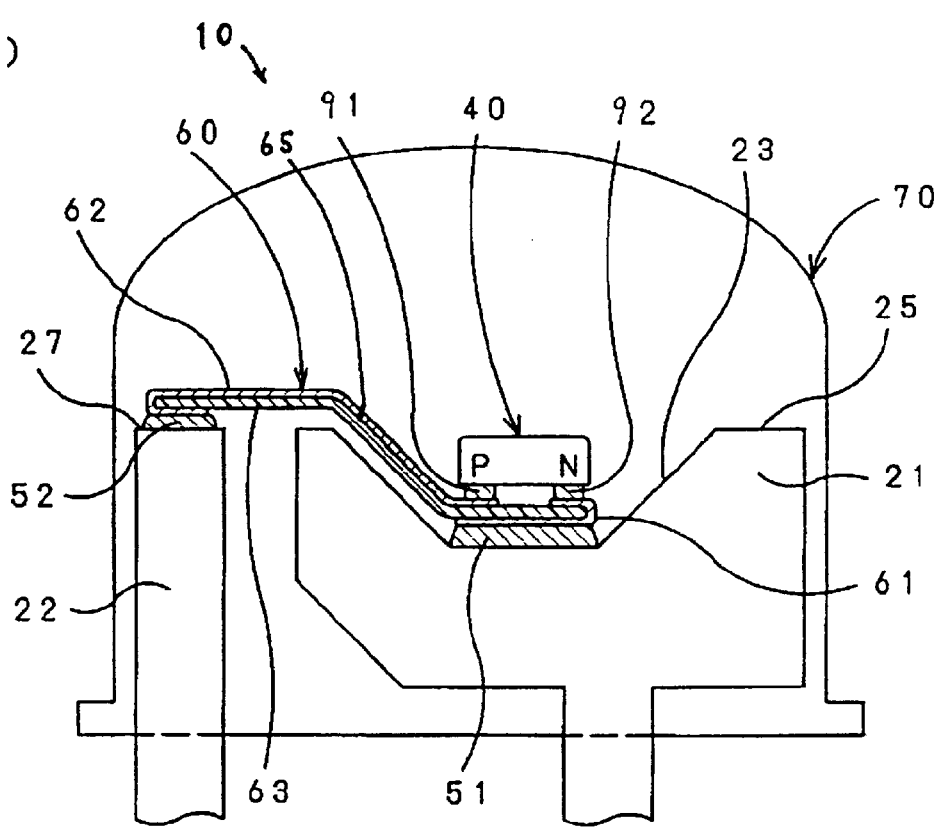

FIG. 1 is a figure showing the light-emitting diode that is the first embodiment of the present invention. (a) is an oblique view near the end of the lead and (b) is a cross section of the entire diode structure.

As illustrated, light-emitting diode 10 has pair of leads 21 and 22 and resin 70 sealing the chip and portions of the leads. One lead 21 has a concave part 23 in its end for holding LED chip 40. The oblique surface on the inside of concave part 23 acts to reflect light emitted from LED chip 40. As shown in the figure, LED chip 40 inside concave part 23 rides on the end of plate-shaped wiring means 60. The two electrodes of LED chip 40 are connected through plate-shaped wiring means 60 to leads 21 and 22, respectively. This structure is described in further detail hereinafter:

As is clear from FIG. 1(b), plate-shaped wiring means 60 comprises a base plate 63 and part of wirings 61 and 62. The base plate 63 is curved in at least two positions, has a middle part 65 extending obliquely, and extends so that it bridges leads 21 and 22. As shown in the figure, when plate-shaped wiring means 60 rides inside of concave part 23, oblique middle part 65 extends such that a gap with an appropriate distance from the inner surface of concave part 23 is made along the inner surfaces. The wirings 61 and 62 can be formed by printing, etc., along the surface of base plate 63. Both wirings form the conductive paths of LED chip 40 and leads 21 and 22.

The wirings 61 and 62 are connected to the electrodes of LED chip 40 at the base of LED chip 40 by solder pastes 91 and 92. In particular, the wiring 61 is folded over the base plate 63 at one end where LED chip 40 is mounted. The wiring 61 extends to overlap only with the position of LED chip 40 (at least the position of solder pastes 91 and 92, which is where LED chip 40 and plate-shaped wiring means 60 are joined) and is connected to lead 21 by solder paste 51. On the other hand, the wiring 62 extends to the end on the other side and is folded over the base of base plate 63 and connected to lead 22 by solder paste 52. It should be noted that LED chip 40 is joined to base 26 of concave part 23 by solder paste 51 and is thereby anchored inside the concave part and stabilized.

Plate-shaped wiring means 60 can be a flexible means, such as a flexible circuit board or ribbon-like wire, or it can be rigid to a certain extent, such as something like a resin plate with a metal core as a base plate 63. The wirings 61 and 62 must be formed on the base plate 63, and therefore, at least the surface thereof should be made from an insulating material.

Figure 2:
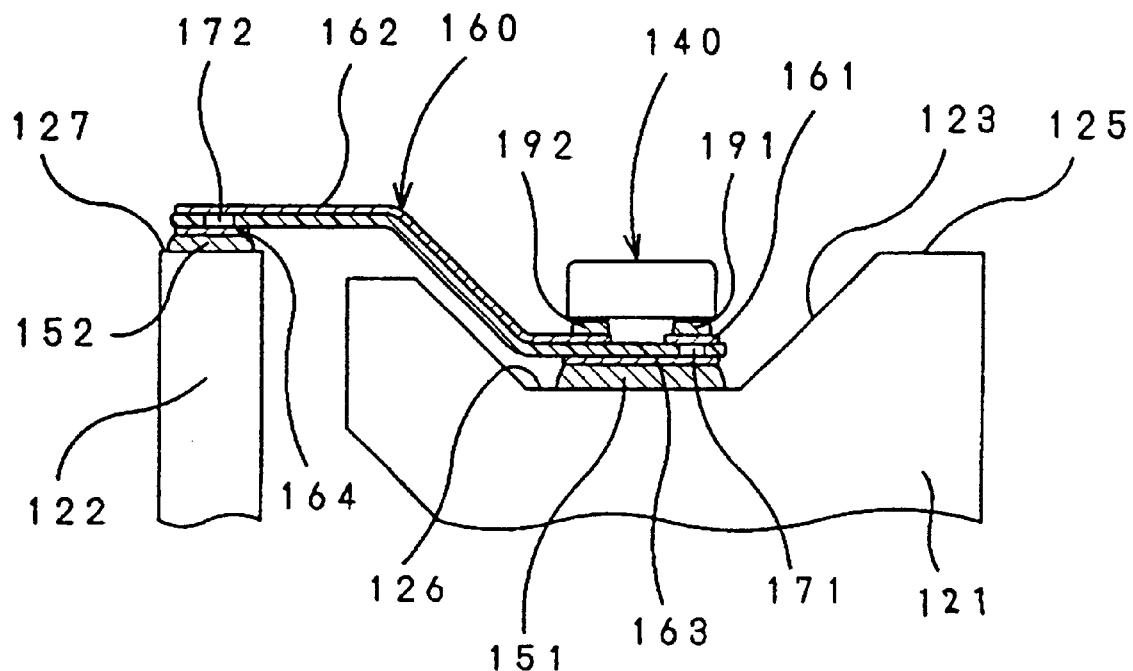
FIG. 2 is a cross section view showing a part close to the end of the lead of the light-emitting diode showing the second embodiment where the plate-shaped wiring means has been modified.
Figure 3:
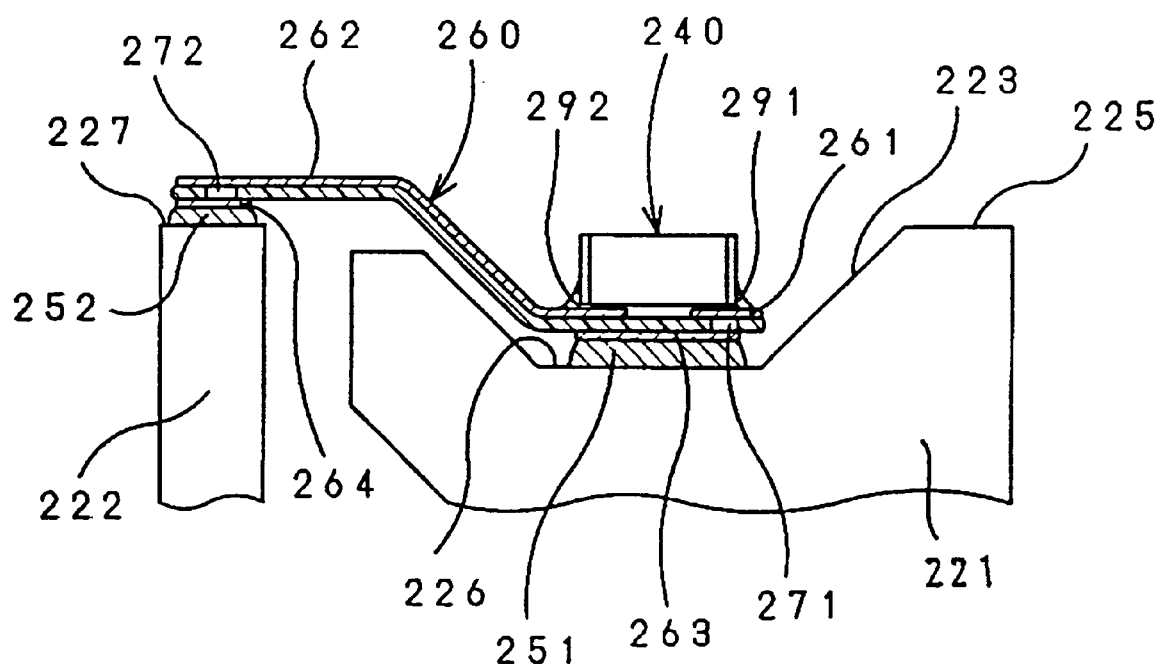
FIG. 3 is a cross section view showing a part close to the end of the lead of the light-emitting diode showing the third embodiment where the plate-shaped wiring means has been modified.

FIGS. 2 and 3 show cross sections around the ends of the leads of the light-emitting diodes that are the second and third embodiments of other wiring means.

According to FIG. 2, LED chip 140 is also connected to leads 121 and 122 through plate-shaped wiring means 160. 100 is added to the reference numerals for the constituents that have the same function or advantage as in FIG. 1 in principal for the explanation. A difference between the embodiments shown in FIG. 2 and FIG. 1 is an arrangement of wirings. That is, plate-shaped wiring means 160 has wirings 161 and 162 and 163 and 164 that are separated at the top and bottom of the base plate and the wirings 161 and 163 and the wirings 162 and 164 are electrically connected through through holes 171 and 172. The wirings 161 and 162 are connected to LED chip 140, while wirings 163 and 164 are connected to leads 121 and 122, respectively.

Moreover, according to FIG. 3, LED chip 240 has plate-shaped wiring means 260 with the same structure as wiring means 160. 200 is added to the reference numerals of the constituents that have the same structure as in FIG. 1. The point of difference between FIG. 3 and FIG. 2 is how LED chip 240 is mounted. The electrodes of LED chip 140 to be connected to the wiring means 160 by solder pastes 191 and 192 are located at the bottom side of the chip 140 as shown in FIG. 2, while in the embodiment shown in FIG. 3 the electrodes are found at the sides of LED chip 240, and LED chip 240 and plate-shaped wiring means 260 are electrically connected by solders 291 and 292. The rest of the structure is similar to the example in FIG. 1 or FIG. 2 and therefore, further description is omitted.

Figure 4:
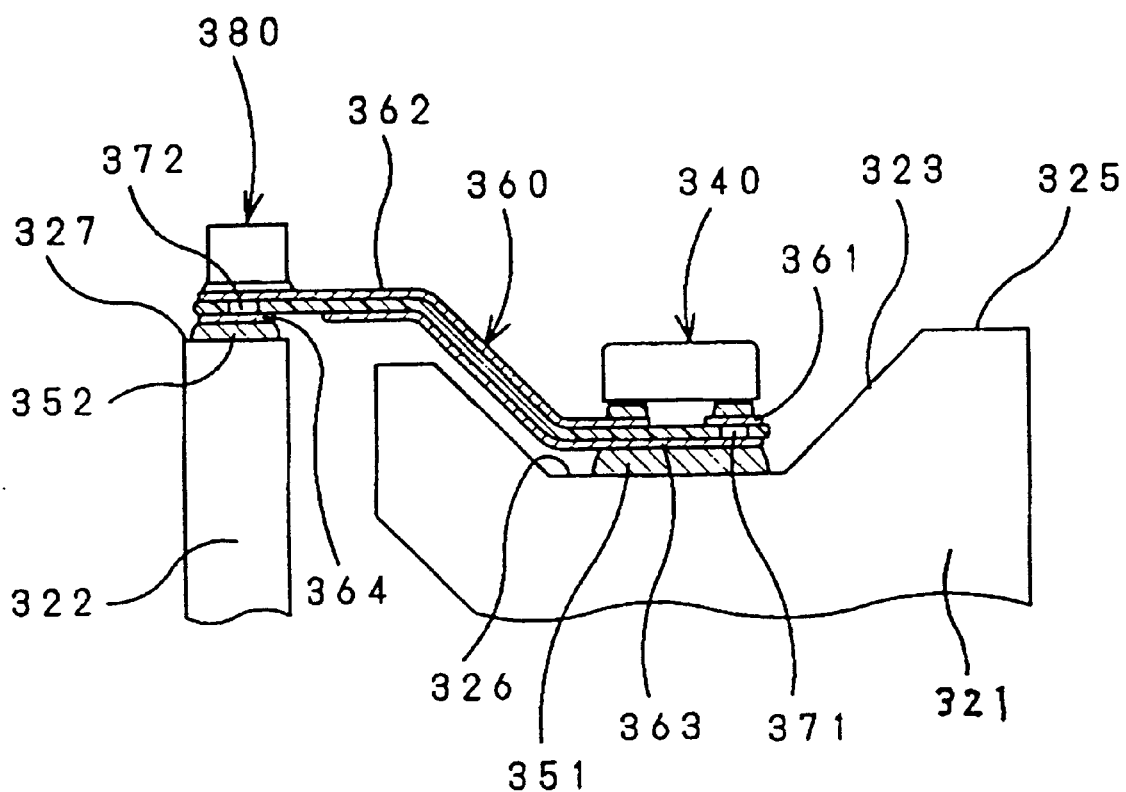
FIG. 4 is a cross section showing a part close to the end of the lead of the light-emitting diode showing the fourth embodiment wherein the plate-shaped wiring means has been modified.

FIG. 4 is a cross section showing the structure close to the ends of the leads of the light-emitting diode that is the fourth embodiment including another modification of the present invention. The basic structure is similar to FIG. 1 and therefore, 300 is added to the reference numerals for constituents having the same function and advantage in principal.

According to this embodiment, electrostatic protective element 380, such as a diode, etc., is further mounted on plate-shaped wiring means 360. Electrostatic protective means 380 is shown in FIG. 4 which is connected to wiring 362, but a protective circuit such as that disclosed in Japanese Kokai Patent No. Sho 62(1987)-299092 can be made on the plate-shaped wiring means 260 so that LED chip 340 is protected from static electricity. Furthermore, it can be seen electrostatic protective element 380 is placed on lead 322. Thus, electrostatic element 380 is stabilized by being mechanically supported by lead 322. Other kinds of electronic elements can be mounted on the plate-shaped wiring means such as a sensor to monitor light emitted from LED or heat generated from the LED chip. Such elements can be mounted together with or instead of the protective elements shown in the embodiment.

Figure 5:
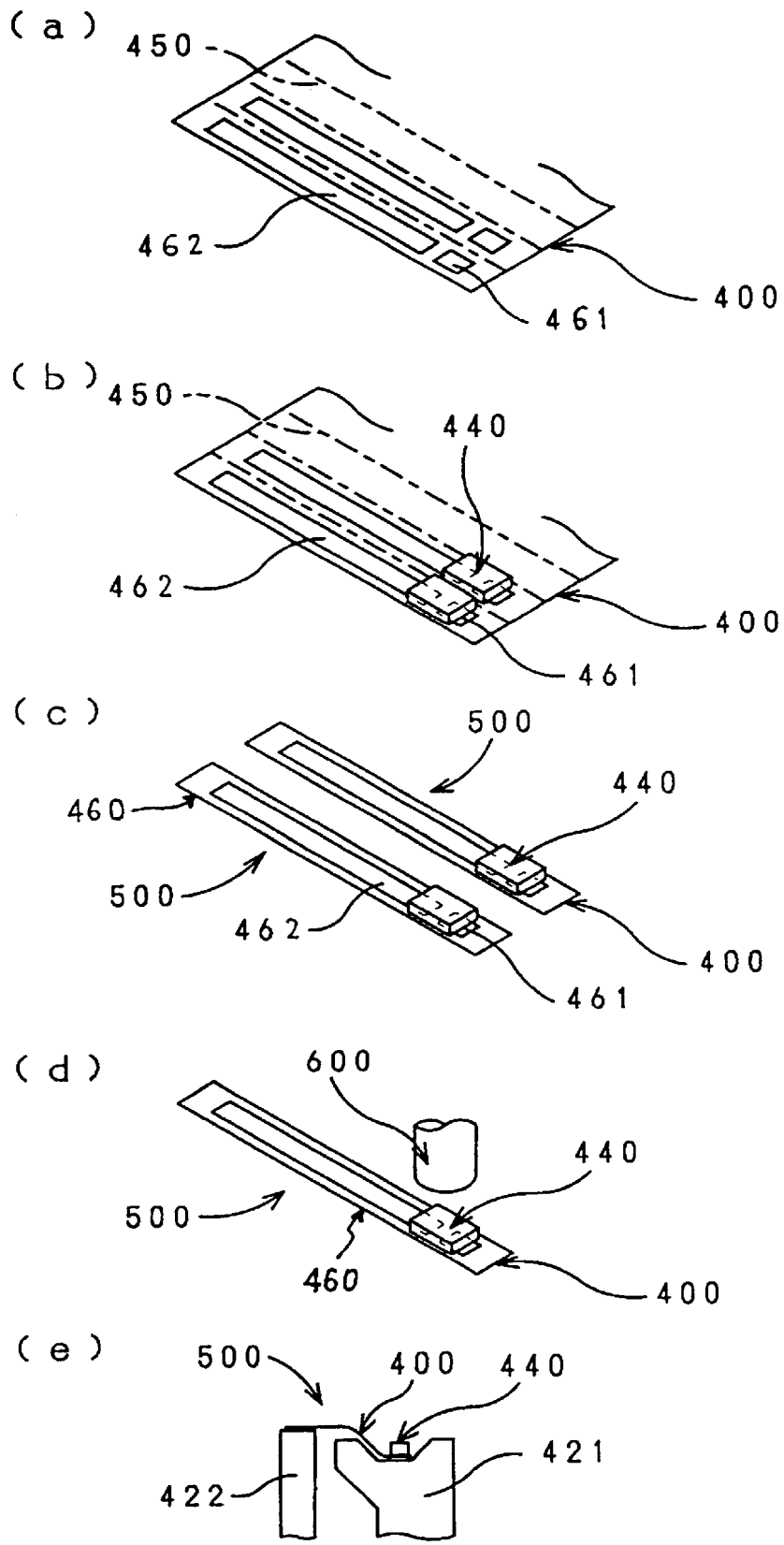
FIG. 5 is a diagram of an example of the method of producing a substrate assembly comprising a plate-shaped wiring means that can be used for each embodiment in FIGS. 1 through 4.

FIG. 5 is a diagram of an example of a method of producing a substrate assembly comprising a plate-shaped wiring means that can be used in each of the embodiments shown in FIGS. 1 through 4. The plate-shaped wiring means in FIG. 5 is represented by reference numeral 460, but it can be plate-shaped wiring means 60, 160, 260, or 360 in other embodiments.

Substantially flat substrate or plate 400 is prepared for the first process of production shown in FIG. 5(a). As previously described, substrate 400 can have flexibility (be flexible) or it can be rigid to a certain extent. Several blocks can be formed in substrate 400 and the appropriate wires (or electrodes) 461 and 462 are formed inside each individual block by printing technology or conventional board-forming technology. A perforation, etc., can be formed at interface 450 of each block.

According to the second process of production shown in FIG. 5(b), LED chip 440 is mounted at an appropriate place for each block on substrate 400. LED chip 440 is close to the end of each block in the illustrated example. Then, as shown in FIG. 5(c), substrate 400 is divided into each block by cutting, etc., and individual substrate assemblies 500, that is, plate-shaped means 460 on which LED chips are individually mounted, are produced.

The operation of each chip-plate assembly 500 having plate-shaped wiring means 460 as the main part can be tested before it is connected to the leads 421, 422. If the chip-plate assembly 500 with LED chip 440 that does not have required performance by performing tests with detector 600, the chip can be removed. Plate-shaped wiring means 460 can be easily handled and consequently, testing can be more efficiently performed. Moreover, defective parts can be found before assembly and therefore, the present invention can reduce waste of materials such as for making the LED product more efficiently than conventional methods where testing is performed after assembly is completed. The chip-plate assembly 500, on which test has been finished, is connected to the leads 421 and 422 and electrical connection is thereby completed.

The light-emitting diode and method of producing the same of the present invention has been explained in detail, but they are strictly examples and do not limit the present invention. Various changes can be applied by persons skilled in the art.

What is claimed is:

1. A light-emitting diode comprising:
    a pair of electrical leads;
    a plate-shaped wiring means comprising at least a first electrical line and a second electrical line, said first electrical line connecting said pair of electrical leads to each other and said second electrical line electrically connected to one of said pair of electrical leads; and
    a LED chip mounted on said plate-shaped wiring means and electrically connected to said pair of electrical leads by said plate-shaped wiring means.

2. A light-emitting diode according to claim 1, wherein said wiring means is a single means.

3. A light-emitting diode according to claim 2, wherein at least one of said pair of leads includes a support part for supporting a portion of said plate-shaped wiring means on which said LED chip is mounted.

4. A light-emitting diode according to claim 3, wherein said support part is concave such that said support part surrounds said LED chip.

5. A light-emitting diode according to claim 1, wherein said wiring means comprises a 3-dimensional wiring means.

6. A light-emitting diode according to claim 1, wherein said wiring means comprises a circuit board or tape-like electrical wire.

7. A light-emitting diode according to claim 1, wherein an electronic element is further mounted on said wiring means, said element being selected from a group of a protective element and a sensor to monitor heat or light.

8. A light-emitting diode according to claim 2, wherein said plate-shaped wiring means includes a pair of chip mounting electrodes mutually separated by only a relatively short distance and a pair of lead connecting electrodes mutually separated by a relatively long distance.

9. A light-emitting diode according to claim 1, wherein said wiring means has flexibility.

10. A light-emitting diode, said light-emitting diode comprising:
    a pair of electrical leads;
    a single plate-shaped wiring means; and
    a LED chip mounted on said single plate-shaped wiring means and electrically connected to said pair of electrical leads by said plate-shaped wiring means, wherein at least one of said pair of electrical leads includes a concave support surrounding said LED chip for supporting a portion of said wiring means.

* * * * *